United States Patent [19]

Shimojo

[11] 3,761,944

[45] Sept. 25, 1973

[54] BINARY CODE GENERATOR

[75] Inventor: Takemi Shimojo, Tokyo, Japan

[73] Assignee: Alps Electric Co., Ltd., Tokyo, Japan

[22] Filed: Jan. 14, 1972

[21] Appl. No.: 217,907

[30] Foreign Application Priority Data

Jan. 22, 1971 Japan .................................. 46/1863
Mar. 8, 1971 Japan .................................. 46/12344

[52] U.S. Cl. ....... 340/365 A, 200/159 B, 317/101 B
[51] Int. Cl. ............................................ H04l 15/06
[58] Field of Search .................... 340/365 A, 365 R; 200/5 A, 159 B

[56] References Cited

UNITED STATES PATENTS

| | | | |
|---|---|---|---|
| 3,688,066 | 8/1972 | Adelson | 200/159 B |
| 3,699,294 | 10/1972 | Sudduth | 200/159 B |
| 3,600,528 | 8/1971 | Leposavic | 340/365 A |
| 3,627,935 | 12/1971 | Spierak | 340/365 A |
| 3,641,286 | 2/1972 | Berezowski | 200/5 A |

*Primary Examiner*—Thomas B. Habecker
*Attorney*—Maxwell James et al.

[57] ABSTRACT

A binary code generator for generating a plural bit binary code from keyboard input data comprises a printed circuit including a plurality of conductive lead groupings arranged in registration with a plurality of pushbuttons on a keyboard frame. The circuit board includes a plurality of electrical terminals one of which is operatively electrically connected to a voltage source and the others of which are selectively operatively electrically connected to the lead patterns forming the conductive lead groupings in accordance with the binary code to be generated. Upon actuation of the pushbutton switch all of the lead patterns in the conductive lead grouping associated with that pushbutton are electrically connected together whereby selected ones of the output terminals are electrically connected to the voltage source thereby to produce a binary output code.

The keyboard is formed of a single integral sheet of resilient material and includes a plurality of conductive resilient contacts normally spaced from the conductive lead groupings on the circuit board. In a preferred embodiment each of the lead patterns in a lead grouping comprises a plurality of radially extending branches and the contact member is formed with a contact surface in the form of a continuous generally circular rim adapted upon depression of its associated pushbutton to bridge a sufficient number of lead branches in the associated lead grouping to provide effective and reliable switching under all conditions. The contacts are electrically and structurally separated from each other by raised strips formed integral on the resilient keyboard sheet and secured by appropriate means to the circuit board, those strips being effective to reliably maintain independent actuation of individual pushbuttons.

2 Claims, 13 Drawing Figures

BINARY CODE GENERATOR

This invention relates to a method and means for generating a binary code signal of the type used to convert decimal input data to binary data for use in a computer.

Today's digital computers almost universally use the binary number system for data processing. The decimal system, on the other hand, is the most convenient and the system most frequently used by human beings. Accordingly, means must be provided for converting decimal data into binary form in a simple and effective manner for use in a computer.

The standard powers of two conversion is extremely awkward and time consuming and accordingly various codes have been evolved for translating decimal digits into combinations of four or more binary digits, each such grouping or code representing a particular decimal. Perhaps the most frequently used code of this type is the 8–4–2–1 or straight binary code which has been adopted by the United States Army Services. Accordingly, while the present invention is applicable to any and all of the various binary coded decimal notations, for convenience it will be described herein with particular reference to the 8–4–2–1 code.

The various keyboard devices designed to accept decimal data and to generate a particular binary code in response to decimal input data are generally known as encoders. More particularly, the function of a binary encoder is to convert discrete inputs, in the form of decimal characters 0–9 (or letters of the alphabet for that matter) into the proper binary coded output data. Thus each single decimal digit represented by the actuation of a particular key results in a 4-bit binary pulse output in the selected binary decimal code. A 4-bit code, having 16 combinations, is the minimum bit code necessary for generating the decimal digits 0–9.

In the past, keyboard encoders of the type described have employed switching elements, such for example as magnetic reed switches, adapted to provide a pulse signal upon the depression of one or more decimal labelled keys. That signal is conventionally transmitted through a matrix arrangement which in turn is adapted to provide the corresponding 4-bit binary pulse output. More particularly, such matrices comprise 10 columns corresponding to the 10 decimal keys and four rows corresponding to the four binary outputs forming a particular binary coded decimal notation. Upon depression of one of the decimal keys the reed switch or other switching device is effective to connect the appropriate column line to a voltage source. The thus generated signal is fed through appropriate matrix connections to the rows representing the logical "1" notation for that particular digit, the rows representing a logical "0" receiving no signal. Thus, for example, in the straight binary or 8–4–2–1 code, the digit 3 is represented by the four-bit combination 0–0–1–1. Accordingly, upon depression of the decimal three key of a conventional keyboard encoder, the voltage source is operatively connected through the three column to the units and 2's rows but not to the 4's and 8's rows, thereby providing an electrical pulse output signal on the four row outputs corresponding to the binary notation 0–0–1–1. In practice, however, it has been found necessary, in order to avoid confusion and erroneous outputs, to provide a unilateral device such as a diode at each operative row column connection which is adapted to conduct the input (decimal) signal to the proper output row while maintaining the several inputs isolated. Accordingly, such matrices are known as diode matrices.

The use of such gating diodes, reed switches and conventional key mechanisms all necessitate a rather large and expensive apparatus for providing the required encoding operation. As a result, present day devices of this type are rather expensive and cumbersome, and require frequent maintenance. This is a particularly significant drawback in the increasingly popular desk-type computers or electronic computer calculators which must be offered at a reasonably low price to be attractive. Moreover, the use of electronic components such as diodes significantly reduces reliability and operating life of the mechanism and greatly increases the maintenance costs.

It is a primary object of the present invention to provide a keyboard operated encoder of the type described which effectively eliminates all of the above problems of prior art apparatus of this type.

It is yet another object of the present invention to provide apparatus for generating a binary code signal in response to key actuated decimal data which does not require the conventional switching devices and diode matrices of prior art mechanisms of this type.

It is yet another object of the present invention to provide a decimal-to-binary encoder utilizing an extremely simple and compact structure with a significantly reduced cost and virtually no maintenance requirement.

It is still another object of the present invention to provide a multi-stage, multi-row pushbutton actuated encoder for generating a binary code which is fabricated of an absolute minimum of simple components and which may be mass produced at a total cost far below that of any of the conventional encoders of this type.

To these ends, the encoder of the present invention provides a simple and reliable method of generating a binary code by selective electrical connection of conductive leads arranged in a novel configuration in response to the depression pushbutton.

According to one aspect of the invention a plurality of conductive leads corresponding to the number of binary code bits required are provided on a circuit board each operatively electrically connected to an electrical terminal representing the binary coded output. A plurality of closely interlaced lead groupings are provided on the circuit board, one such grouping for each decimal digit, letter (in the case of alpha-numeric notation) or other notation used as the input. Each such interlaced grouping comprises a plurality of independent leads of sufficient number to provide the required electrical connections for the generated binary code. A pushbutton switch actuator is provided in registry with each conductive lead grouping and adapted upon depression of that pushbutton, to operatively electrically connect all of the conductive leads in that grouping. One lead of each grouping is operatively electrically connected to a voltage source, the remaining leads being operatively selectively connected to the output terminals. As a result, the depression of a selected key is effective to operatively electrically connect all leads of the corresponding interlaced grouping to the voltage source thereby to produce a selected binary coded output at the output terminals.

The pushbutton switching arrangement herein utilized is an improved structure of the type disclosed in copending applications Ser. No. 172,637 by Takemi Shimojo and entitled "Push-Button Switch With Resilient Conductive Contact Member" and Ser. No. 172,765 by Makoto Yanaga et al, entitled "Push-Button Switch With Resilient Conductive Contact Member and With Helical Conductive Networks," both filed Aug. 18, 1971 and both assigned to the assignee of the present invention.

Briefly, the switch comprises a resilient pushbutton member operatively mounted on a cover member normally spaced from the conductive lead grouping and resiliently movable toward the circuit board. The pushbutton member is formed of a sheet of resilient insulating material, and is provided on its underside with a contact member fabricated of elastic electrically conductive material, such as conductive rubber. When the pushbutton member is pressed it flexes toward the circuit board and the resilient contact member engages the spaced leads thereof bridging the separation between them thereby to electrically connect all of the leads in that group to the voltage source.

In accordance with a preferred embodiment of the invention, the interlaced lead groupings are arranged in a pattern having substantial point symmetry, each individual lead traversing a plurality of radial paths spaced around the center of the grouping. The resilient contact member is in turn provided with a generally circular contact rim adapted even when engaging the circuit board along only a small portion of its periphery to engage all lead lines at least once. As a result, reliable code switching is attained with fingertip pressure even when the pushbutton is pressed in a substantially off center or oblique manner.

When used in a desk calculator or other keyboard device, the entire keyboard may be formed of a single sheet of resilient insulating material, each key being appropriately delineated on its outer finger engageable face, and including a depending contact member as described above on its underside in registry with the proper conductive lead grouping. A plurality of integrally formed resilient bracing strips are provided between individual pushbuttons. Those strips serve the dual function of supporting the buttons in spaced relation on the circuit board and in addition maintaining those buttons electrically and structurally separate from each other and from conductive leads not associated with its individual lead grouping. As a result each button may be actuated completely independently of the others and reliable operation is insured.

In an alternative embodiment of the pushbutton structure, a rigid pushbutton member is mounted for sliding movement towards and away from the circuit board, spring biased away from said board, and provided at its underside with a resilient contact member, which, in the spring biased position of the pushbutton member, is spaced from the conductive lead grouping on the board. Depression of the button against the bias of the spring is effective to electrically connect all leads in a given grouping.

Representative lead patterns for groupings of three, four and five leads are disclosed. The resilient contact surface of the corresponding pushbutton may be appropriately modified to provide optimum electrical contact with all leads in accordance with the pattern utilized. The fact that the operative contact member is not only electrically conductive but also resilient insures effective operation and reliability under all conditions. In addition, the "feel" of the switch is greatly enhanced, chattering is eliminated, and fingertip control providing increased speed is attained without the need for electrically or magnetically actuated switching mechanisms.

The structure herein described comprises a minimum of inexpensive parts which may be assembled quickly and inexpensively to provide a surprisingly effective low cost keyboard operated encoder for a desk calculator or other data processing apparatus.

To the accomplishment of the above and to such other objects as may hereinafter appear, the present invention relates to a method and apparatus for generating a binary code signal as defined in the appended claims and as described herein with reference to the accompanying drawings, in which:

The present invention provides a method of converting input data comprising a plurality of numbers, letters or other symbols into data in the form of a binary signal, each symbol being represented by a plural bit binary code. This method is particularly applicable to portable or desk type computors having a decimal digit keyboard but is suitable for use in any digital data processing or communications appratus using encoders for input data in decimal, alpha-numeric or other formats.

The invention is here specifically described, merely for illustrative purposes in connection with the generation of a four-bit straight binary (8–4–2–1) code from input data in the form of decimal digits 0–9 and a decimal point. It will be appreciated, however, that the device here specifically described may be appropriately modified for use with other four-bit codes and indeed with binary codes of more or less than four bits.

A four-bit binary code comprises 16 distinct combinations of the logical "1" and "0" states and thus is the minimum bit output required for the representation of the eleven inputs in the decimal system (10 digits plus a decimal point). In a straight binary code each decimal is represented by its binary powers of two conversion, unused columns being at logical "0" (hence the designation 8–4–2–1, indicating the eight's, four's, two's, and units columns in binary notation). In the following description the decimal "0" is represented by the binary code "1010" which is the binary conversion of decimal "10" and the decimal point "." is represented by the binary code 1011, the binary conversion of decimal "11."

Figure 1:
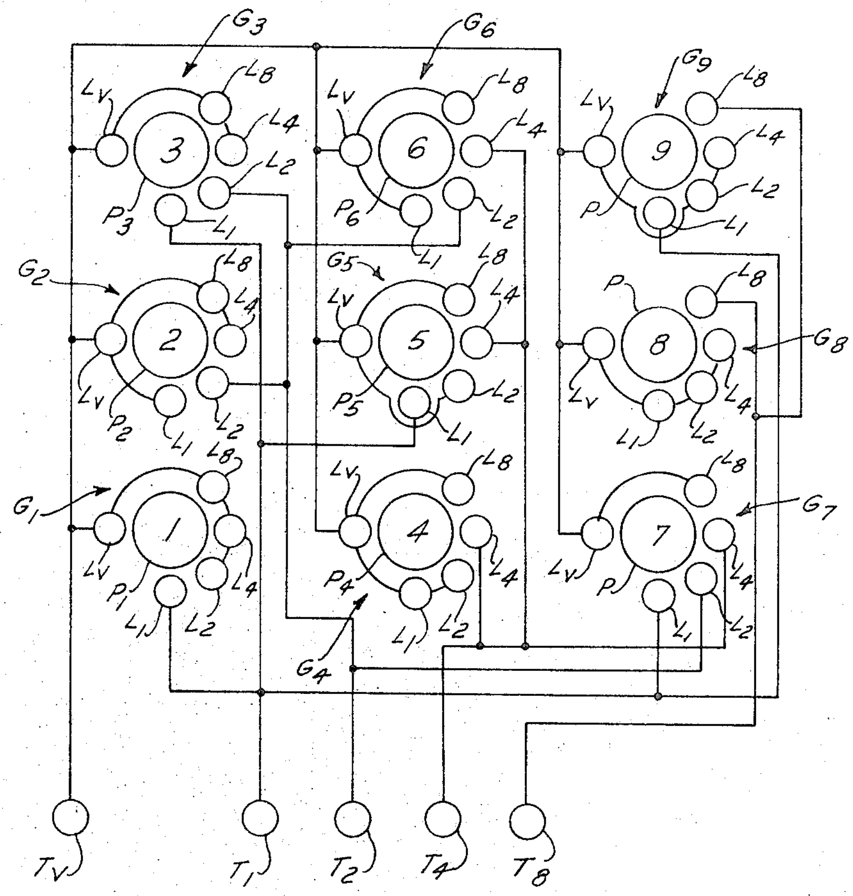
FIG. 1 is a schematic wiring diagram illustrating the method of generating a binary code in accordance with the present invention.

The method of generating a four-bit 8–4–2–1 binary code in accordance with the present invention is best illustrated schematically by the wiring diagram of FIG. 1, wherein nine pushbuttons P shown as large circles numbered 1–9 schematically represent a digital keyboard for a desk calculator or the like (the "0" and decimal point "." buttons are not shown in order to simplify the diagram). Each pushbutton P is associated with a grouping G of five conductive leads or wires here represented by five smaller circles designated L1, L2, L4, L8 and LV for reasons hereinafter apparent. The actuation of a pushbutton P is effective to operatively electrically connect all five conductive leads of the lead grouping with which it is associated. For example, the actuation of pushbutton P1 is effective to electrically connect leads L1, L2, L4, L8 and LV of lead grouping G1.

Leads L1 – L8 of each grouping G are selectively electrically connected to four output terminals T1, T2, T4 and T8, the logic levels of those terminals representing the units, two's four's and eight's columns of the 4-bit binary code output. Thus, if the code for a particular decimal digit calls for a "1" in a particular column, one of the four leads L1, L2, L4, or L8 of the group G associated with that digit is connected to the proper output terminal. Where a "0" output is required in a particular column, none of the leads of the group associated with that digit is connected to that output terminal T.

The fifth lead $L_V$ of each group G is operatively electrically connected to a fifth terminal $T_V$, that terminal in turn being adapted in operation to be connected to a voltage source. Accordingly, each time a pushbutton P is actuated all the leads L in the lead grouping G associated with that button are operatively electrically connected to a voltage source. The leads L in that grouping are effective, in accordance with the coded wiring plan shown, to impress that voltage on selected ones of the four output terminals T1, T2, T4 and T8, thereby to generate the correct four-bit code for that digit. For example, the four-bit straight binary code for the decimal digit "5" is "0101." Consequently, the L1 lead of lead group G5 is connected to the T1 output terminal (representing a logic "1" in the units column) and the L4 lead of that group is connected to the T4 output terminal (representing a logic "1" in the four's column). Neither the T2 nor the T8 output terminals are connected to the leads of group G5 (representing a logic "0" in the two's and eight's columns). As a result, upon depression of pushbutton P5 output terminals T1 and T4 are connected to the voltage source while output terminals T2 and T8 are not, whereby the proper code, "0101" for decimal digit "5" appears at the output. As will be hereinafter explained in more detail, the unused leads L of each group G (those not connected to any output terminal T) may be permanently electrically connected to the voltage source lead $L_V$ or one of the other used leads to increase effectiveness and reliability of the code signals.

It will be appreciated that the number of leads required for each grouping depends upon the number of coded outputs required. Thus, in a four-bit code, there are a maximum of 24 or 16 distinct possible codes. If all 16 codes are utilized, then a minimum of five leads (one of which is a voltage source lead) are required. While, for the sake of clarity five leads are shown in the groupings of FIG. 1, it will be apparent that four would suffice, since only nine of the possible 16 codes are utilized, none of which requires all four code leads L1, L2, L4 and L8 (representing the binary code "1111" corresponding to decimal 16). Indeed, conductive lead groupings of three, four, five or more may be required depending upon the particular application. Three such groupings are schematically illustrated in FIGS. 2A–2C.

Figure 2A:
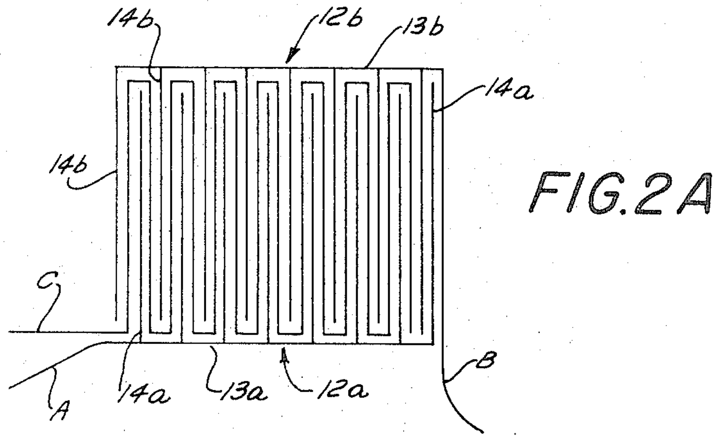
FIGS. 2A–2C are schematic wiring diagrams illustraing lead network patterns for groups of three, four and five conductive leads, respectively.

FIG. 2A shows a grouping of three leads A, B and C comprising a pair of interleaved comb-like networks 12*a* and 12*b* having horizontal bases 13*a* and 13*b*, respectively, and a plurality of closely spaced vertical interleaved fingers 14*a* and 14*b*, respectively, the ends of those fingers being spaced from the base of the opposing comb thereby to define a serpentine path. Lead C in turn traverses that serpentine path between the fingers 14*a* and 14*b*.

Figure 2B:
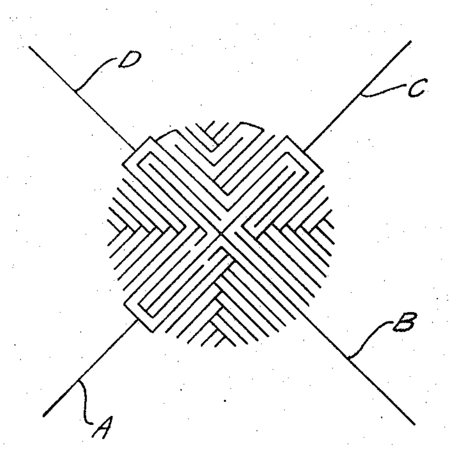

FIG. 2B shows a grouping of four leads A, B, C and D utilizing a pattern of closely spaced interleaved leads extending exclusively in each of four mutually perpendicular directions and having a circular outline.

Figure 2C:
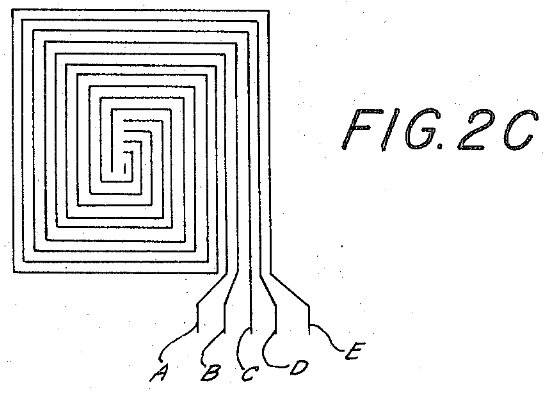

FIG. 2C illustrates a grouping of 5 leads A, B, C, D and E in a "so-called" square helical pattern similar to that illustrated in the aforementioned Yanaga et al copending application Ser. No. 172,765. Again it will be noted that each of the four leads extends in each of four mutually perpendicular directions. Other possibilities will be apparent to one skilled in the art.

Figure 3:
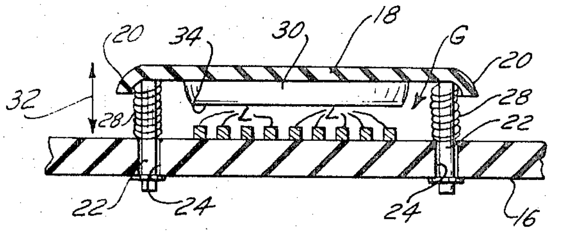
FIG. 3 is a fragmentary cross sectional view of one embodiment of a pushbutton device for use in the code generating apparatus of the present invention.

One embodiment of a pushbutton switch usable with the lead groupings and binary code generating network of this invention is illustrated in FIG. 3. As there shown, the lead grouping G, schematically illustrated by a plurality of leads L extending into the paper, are disposed on a circuit board or substrate 16. A pushbutton member 18 comprising a flat sheet of substantially rigid insulating material, such as a synthetic plastic having a downturned lip 20 is mounted directly over the lead grouping G by means of a pair of vertically depending posts 22. Those posts are slidably received in a pair of openings 24 in the circuit board 16 and are provided with stop washers 26 at their free ends to limit the upward travel of the button. A pair of coil springs 28 are mounted concentrically on posts 22 and are compressed between the circuit board 16 and the underside of the pushbutton member 18 thereby to bias the member 18 to its uppermost position as illustrated. A contact member 30 of resilient conductive material, such for example as conductive rubber, is affixed to the underside of the member 18, and in the uppermost position shown, is spaced from leads L on the circuit board 16. Upon depression of the pushbutton in the direction indicated by arrow 32, the springs 28 are further compressed and the pushbutton member 18 moves downwardly, the resilient contact member firmly engaging spaced leads L to bridge the gap therebetween and establish good electrical contact between all the leads.

The use of a resilient contact 30 greatly enhances effective electrical contact, produces a good feel to the operator and eliminates chattering. The contact surface 34 of the contact 30 may be flat or may be provided with various other configurations as explained in the aforementioned copending applications, depending upon the pattern of the conductive lead grouping G utilized.

Figure 4:
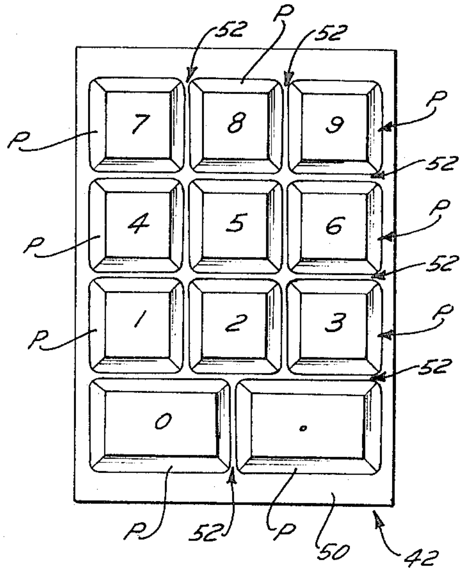
FIG. 4 is a top plan view of a keyboard operated desk calculator utilizing the binary encoder of the present invention.
Figure 5:
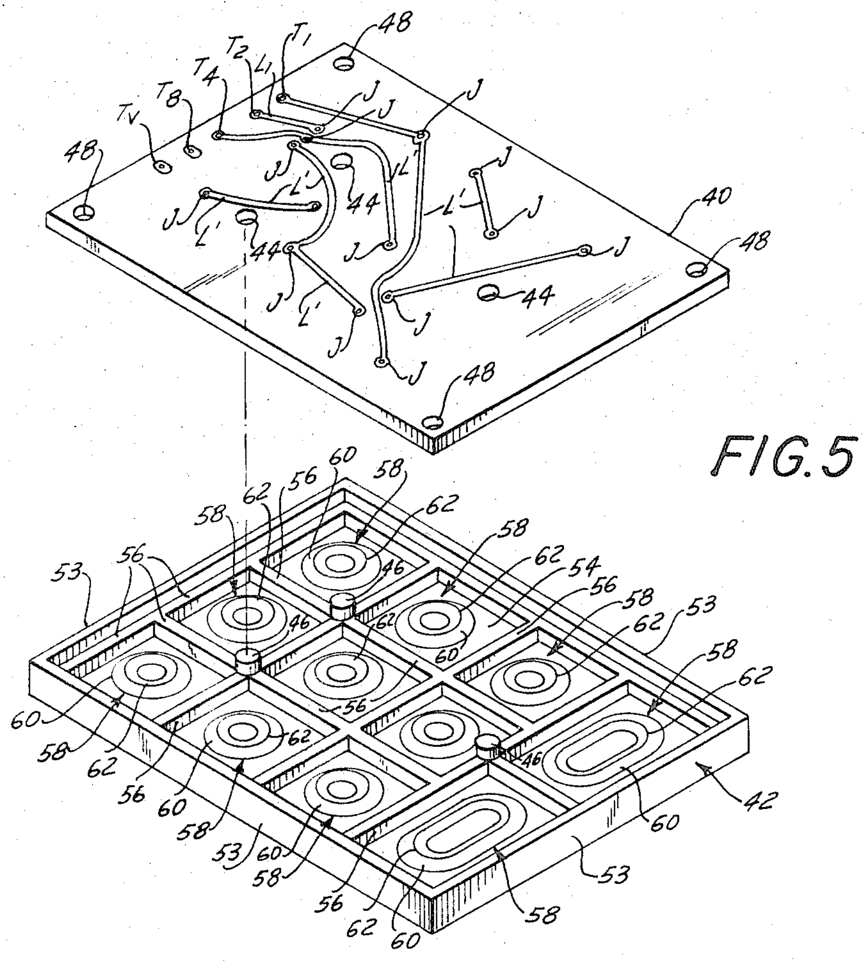
FIG. 5 is an enlarged exploded perspective view of the encoder of the present invention in an inverted position showing the circuit board, keyboard frame and resilient contact members.

A complete encoder constructed in accordance with the present invention will now be described with reference to FIGS. 4–8. As best illustrated in FIG.5, the encoder comprises only two simple structural components—a flat circuit board 40 and a keyboard frame or cover member generally designated 42. For descriptive purposes, these parts are illustrated in exploded view in an inverted position in FIG. 5. Circuit board or substrate 40 is preferably made of a rigid insulating material and is provided with a plurality of apertures 44 adapted to receive mating studs 46 extending from the keyboard frame 42 thereby to accurately align the two in the assembled condition. The board 40 and cover 42 may be secured to one another in final assembly by means of any suitable securing means received through apertures 48 at the corners of the board 40.

The cover member 42 is formed of a single integral sheet of resilient insulating material, having enough stiffness, however, to provide a relatively stable keyboard frame. As best shown in FIG. 4 which is a top plan view of the keyboard, individual keys or pushbuttons P are formed in a multi-column, multi-row arrangement integral on the upper surface 50 of the cover member 42, horizontal and vertical indentations 52 on the cover surface 50 serving to separate individual pushbuttons P (see also FIGS. 7A and 7B). The pushbuttons are provided with indicia indicating the input data—in this case there are eleven keys labelled 0–9 and "." (representing the decimal point).

Referring again to FIG. 5, it will be seen that the cover member 42 includes side walls 53 and is provided at its under surface with intersecting raised strips 56 registering with the indentations 52 on the reverse side, those strips defining individual pushbutton portions on the underside of the keyboard. The under surface 56 is provided with a plurality of resilient electrically conductive contact members generally designated 58 registering with each pushbutton on the reverse side, each contact member 58 being separated from the others by strips 56.

Figure 6:
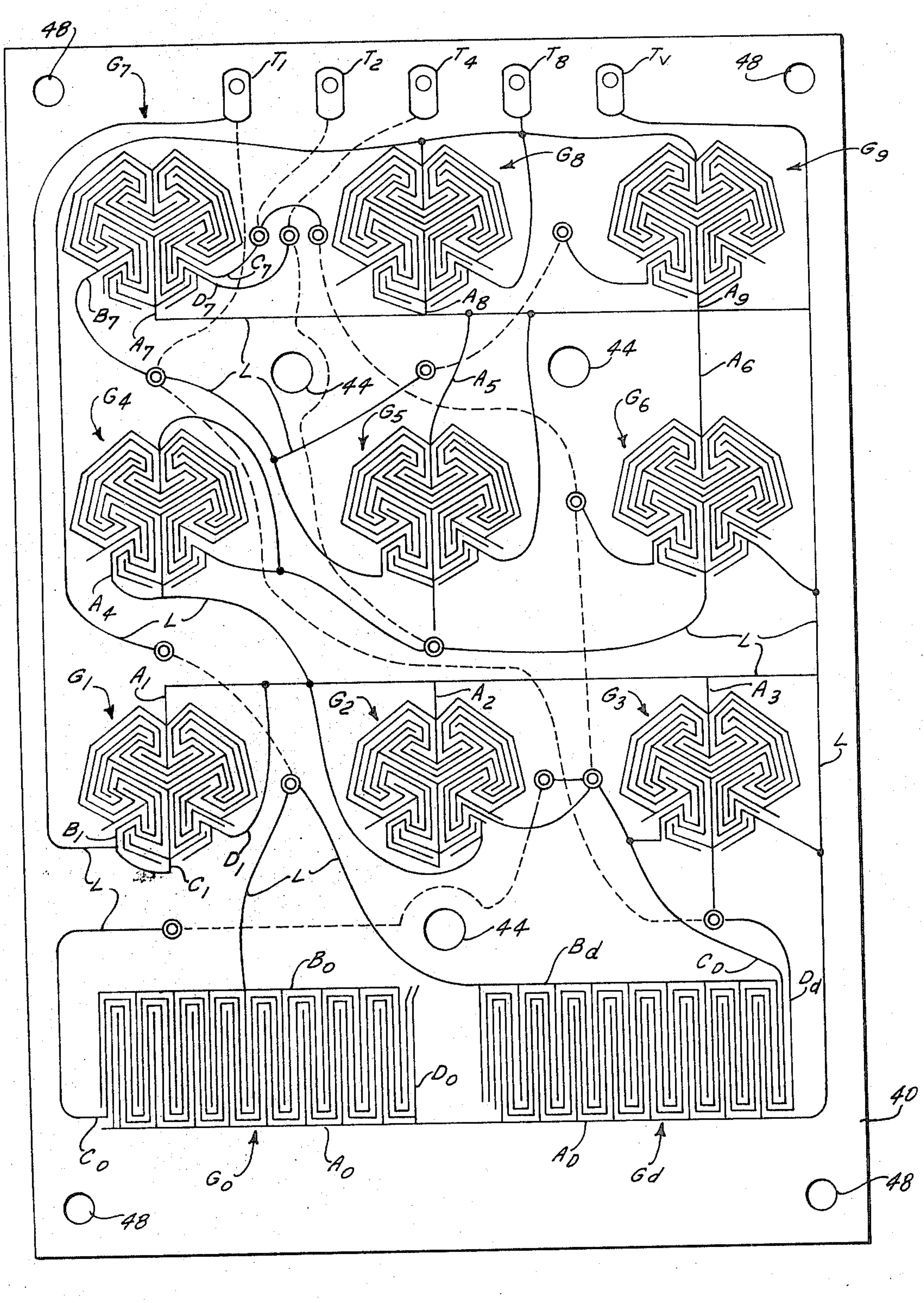
FIG. 6 is an enlarged plan view of the circuit board of the encoder of FIG. 5 showing the conductive lead groupings and terminal connections for an 8–4–2–1 digital-to-binary encoder.

The circuit board wiring is best illustrated in FIG. 6 which shows the conductive lead lines L on the side of the board 40 facing the cover member 42, the cross over leads L′ on the reverse side being indicated by broken lines. As there shown, the five electrical terminals T1, T2, T4, T8 and $T_V$ are disposed at the top of the board and are preferably provided with means on the reverse side for making external connections. The conductive lead groupings G1 – G9 are disposed in precise registery with the contacts 58 associated with the pushbuttons P labelled 1–9 respectively, and each comprises four conductive leads A, B, C and D in the form of a unique interlaced "snow crystal" type pattern generally having point symmetry. Each of the four lead networks is provided with at least three generally radially extending fingers 120° apart. The lead groupings $G_o$ and $G_d$ are generally rectangular in outline and are positioned on board 40 in registry with the contacts 58 associated with the zero ("0") and decimal point (".") pushbuttons P on the cover member 42. Those groupings are similar to that shown in FIG. 2A except that each comprises four (instead of three) independent leads A, B, C and D, two serpentine paths C and D being provided (instead of the one in FIG. 2A) in parallel between the interleaved fingers of the two comb networks A and B.

The leads A of each group are connected by lead lines L and L′ to the voltage source terminal $T_V$. The remaining leads B-D of each grouping G are operatively electrically selectively connected by lead lines L and L′ to the terminals T1 – T8 thereby to generate the four-bit binary code output in a manner described above with reference to the schematic illustration of FIG. 1. For example, when the number "7" pushbutton P is pressed, the leads $A_7$ – $D_7$ are all electrically connected to each other and to the voltage source through lead $D_7$ which is connected to terminal $T_V$. It will be seen that the lead $B_7$ is connected to terminal T1, the lead $C_7$ is connected to terminal T2 and the lead $D_7$ is connected to the terminal T4, thereby resulting in the four-bit straight binary output code "0111" for 7. It will be apparent that since this code requires three logic "1" outputs, the leads B, C and D are all used. When less than three logic "1" outputs are needed, the "unused" leads are preferably permanently connected to one of the "used" leads. Thus, for example, the code for decimal "1" is "0001" so that only one lead B1 (besides the always used voltage source lead A), connected to output terminal T1, is needed. Accordingly, as shown the unused lead C1 is connected to the lead B1 and the unused lead D1 is connected to the voltage source lead A1. The circular junction points J in the wiring diagram represent the points at which leads L on the inside surface of the board 40 pass through the board and are operatively connected to the leads L′ on the other side of the board (see FIG. 5). As a result, all leads are used to make the appropriate electrical connections upon depression of a pushbutton P and the quality, isochronism and reliability of the resulting code signal is considerably enhanced.

Figure 7A:
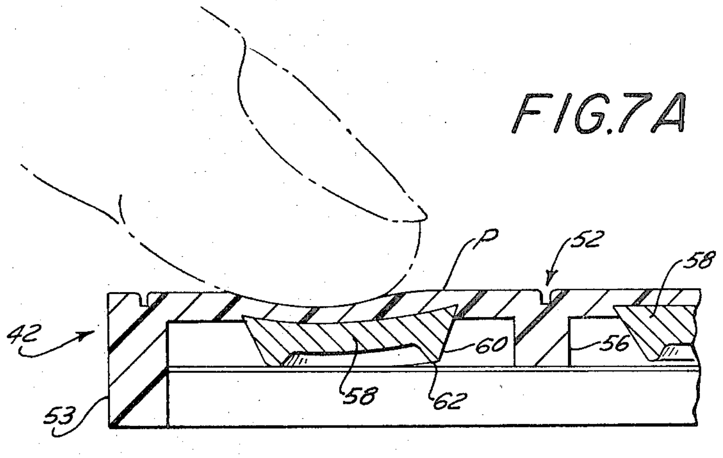
FIG. 7A is a fragmentary side elevational view, partly in section, of the encoder showing the normal fingertip operation of a pushbutton.
Figure 7B:
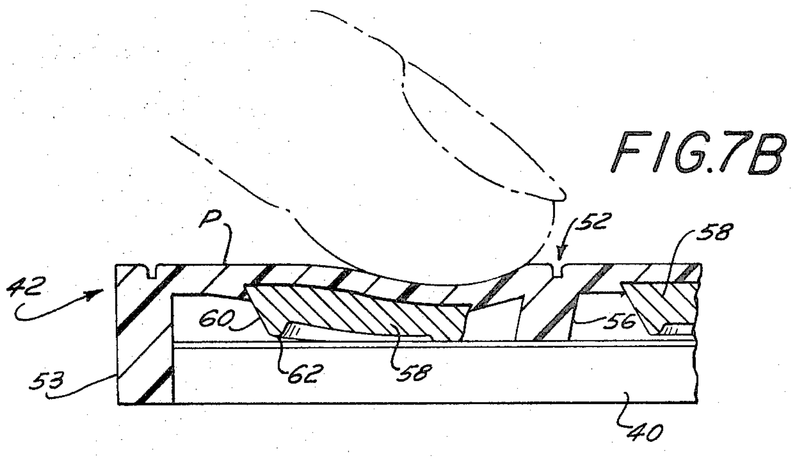
FIG. 7B is a view similar to FIG. 7A showing a careless fingertip actuation of a pushbutton.
Figure 8A:
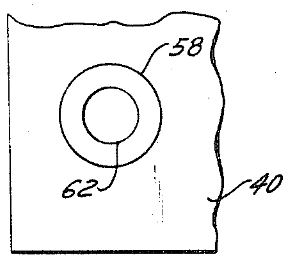
FIGS. 8A–8C are schematic illustrations showing the operative electrical contact effected by the pushbutton contact member of the present invention for three degrees of finger manipulation.
Figure 8B:
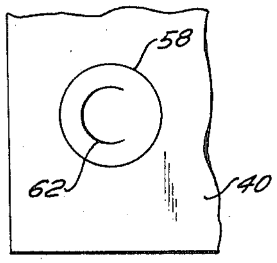
Figure 8C:
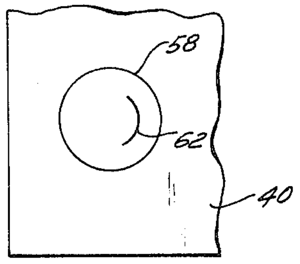

Good electrical contact is further insured by the use of a resilient contact member 58 having an improved contact surface particularly effective for use with the lead groupings illustrated in FIG. 6. That contact member 58 is best illustrated in FIGS. 5 and 7A and 7B and includes a peripheral raised continuous rim 60 having a relatively sharp edge 62. As best shown in FIG. 7A (which illustrates one of the circular rim contacts for use with pushbuttons 1–9), the edge 62 of contact 58 is normally slightly spaced from its associated lead grouping on the circuit board 40 and upon only slight depression of the resilient pushbutton P is brought into electrical engagement with the underlying leads. FIG. 7A illustrates a normal light "touch type" finger engagement of the pushbutton P resulting in a good contact of the entire resilient conductive rim edge 62 with the underlying leads. That engagement is illustrated schematically in FIG. 8A. It will be apparent that under these conditions the contact engages all of the radially extending branches of the four conductive networks of the grouping G, thereby providing extremely good electrical contacts. However, even if the pushbutton P is engaged off center and/or pressed in an oblique direction such as that illustrated in FIG. 7B, good electrical contact is made. Thus, FIG. 8B illustrates schematically the partial contact of the rim edge 62 such as might result from the finger engagement illustrated in FIG. 7B. As shown, while the edge 62 engages the underlying leads only along an approximately 200° arc, it will still engage at least one radial extension of each of the four leads in the grouping. Indeed, such will be the case even if as little as a 120° arc of the rim edge 62 engages the leads. Moreover, the lead grouping patterns of groups 1–9 are designed such that three of the four lead networks have more than three radial extensions. This, in addition to the fact that on all of the groupings, at least one unused lead network is permanently connected to a used network, insures good electrical contact under all conditions.

The contact members 58 associated with the zero ("0") and decimal (".") rectangular pushbuttons are similarly designed with a continuous contact rim 60 for good electrical contact. For these contacts, however, the rim is oval in shape thereby to extend longitudinally horizontally across all of the vertically extending lead branches of lead groupings $G_o$ and $G_d$.

Finally, the raised strips 56 of the cover member 42 are preferably adhesively secured to the circuit board 40 in the final assembly to provide increased lateral stability of the keyboard face and to insure independent operation of the pushbuttons P. Thus, as best shown in FIG. 7A, an off center and/or oblique depression of one pushbutton P is substantially structurally isolated from an adjacent pushbutton by strips 56 which may lean laterally, as shown but maintain the contact member 58 of that adjacent pushbutton spaced from the circuit board. This is particularly important, where, as is desirable, the contact rim edge 62 is normally spaced only a small distance from the circuit board to provide a "touch type" actuation with increased speed.

It will be appreciated from the foregoing that I have provided a method and apparatus for generating a binary code of surprisingly simple and inexpensive construction yet having an increased effectiveness and reliability. The present invention tremendously reduces cost by eliminating the need for diode matrices, magnets and reed switches. In addition, the elimination of these components greatly reduces the space requirement resulting in an unusually compact device. Moreover, by using only simple non-electronic components, the device is rendered virtually foolproof in operation, requires virtually no maintenance, and may be assembled quickly at a substantially reduced cost.

Because of this simplicity, low cost and increased reliability, devices made in accordance with the present invention are attractive for use with all types of digital data processing and communications apparatus and particularly for use in low cost desk-type calculators and computers.

While only a limited number of embodiments of the present invention have herein been specifically described, it will be appreciated that many variations may be made therein without departing from the scope of the invention, as defined in the following claims.

I claim:

1. A binary code generator for generating a plural bit binary code, comprising a circuit board, a plurality of electrical terminals on said circuit board, one of said terminals being adapted to be connected to a voltage source, a plurality of conductive lead groupings on said circuit board, each grouping comprising a plurality of closely spaced interlaced lead patterns, one of said lead patterns being operatively electrically connected to said one electrical terminal, others of said lead patterns being connected to a selected one or more of said other terminals in accordance with a binary code, and switch means associated with each lead grouping adapted when actuated to provide operative electrical engagement between said plurality of lead patterns in said lead grouping, thereby to electrically connect said selected one or more terminals to said voltage source, wherein said switch means comprises a movable electrical contact adapted when said switch means is actuated to move into electrical engagement with said conductive lead grouping, wherein said switch means is a pushbutton switch comprising a depressible pushbutton member manually engageable on one side, said contact member being secured to its other side facing and normally spaced from said conductive lead grouping on said circuit board and having a contact surface movable into engagement with the lead patterns of said conductive lead grouping when said pushbutton is depressed, and wherein said conductive lead patterns each include a plurality of radially extending branches, and wherein said contact surface is defined by a substantially circular rim extending in a direction toward said circuit board, said circular rim being adapted to conductively bridge all of said radially extending branches when said pushbutton member is depressed.

2. A binary code generator for generating a plural bit binary code, comprising a circuit board, a plurality of electrical terminals on said circuit board, one of said terminals being adapted to be connected to a voltage source, a plurality of conductive lead groupings on said circuit board, each grouping comprising a plurality of closely spaced interlaced lead patterns, one of said lead patterns being operatively electrically connected to said one electrical terminal, others of said lead patterns being connected to a selected one or more of said other terminals in accordance with a binary code, and switch means associated with each lead grouping adapted when actuated to provide operative electrical engagement between said plurality of lead patterns in said lead grouping, thereby to electrically connect said selected one or more terminals to said voltage source, wherein said switch means comprises a movable electrical contact adapted when said switch means is actuated to move into electrical engagement with said conductive lead grouping, wherein said switch means is a pushbutton switch comprising a depressible push-button member manually engageable on one side, said contact member being secured to its other side facing and normally spaced from said conductive lead grouping on said circuit board and having a contact surface movable into engagement with the lead patterns of said conductive lead grouping when said pushbutton member is depressed, wherein said depressible pushbutton members are all formed integrally on a single sheet of resilient insulating material, and means securing said sheet of resilient insulating material to said circuit board with said pushbutton members spaced and said contacts spaced from said circuit board, and wherein said conductive lead patterns each include a plurality of radially extending branches, and wherein said contact surface is defined by a substantially circular rim extending in a direction toward said circuit board, said circular rim being adapted to conductively bridge all of said radially extending branches when said pushbutton member is depressed.

* * * * *